(12) United States Patent
Wang

(10) Patent No.: US 6,201,835 B1
(45) Date of Patent: Mar. 13, 2001

(54) FREQUENCY-SHAPED PSEUDO-RANDOM CHOPPER STABILIZATION CIRCUIT AND METHOD FOR DELTA-SIGMA MODULATOR

(75) Inventor: Binan Wang, Tucson, AZ (US)

(73) Assignee: Burr-Brown Corporation, Tucson, AZ (US)

(*) Notice: Subject to any disclaimer, the term of this patent is extended or adjusted under 35 U.S.C. 154(b) by 0 days.

(21) Appl. No.: 09/263,009

(22) Filed: Mar. 5, 1999

(51) Int. Cl.[7] .................................................. H04B 14/06
(52) U.S. Cl. .............................................. 375/247; 341/143
(58) Field of Search .................................. 375/247, 254; 341/77, 143, 172; 327/124

(56) References Cited

U.S. PATENT DOCUMENTS

| | | | |
|---|---|---|---|
| 4,571,546 | 2/1986 | Wilkinson | 328/61 |
| 4,939,516 | 7/1990 | Early | 341/143 |
| 4,994,805 | 2/1991 | Dedic et al. | 341/143 |
| 5,001,725 | 3/1991 | Senderowicz et al. | 375/224 |
| 5,039,989 | 8/1991 | Welland et al. | 341/143 |
| 5,065,157 | 11/1991 | Ribner et al. | 341/143 |
| 5,068,660 | 11/1991 | Swanson et al. | 341/143 |
| 5,115,202 | 5/1992 | Brown | 330/9 |
| 5,148,167 | 9/1992 | Ribner | 341/143 |
| 5,287,107 | 2/1994 | Gampell et al. | 341/137 |
| 5,416,434 | 5/1995 | Kootstra et al. | 327/113 |
| 5,450,028 | 9/1995 | Therssen | 327/91 |
| 5,459,432 | 10/1995 | White et al. | 329/307 |
| 5,477,481 | 12/1995 | Kerth | 364/825 |
| 5,495,200 | 2/1996 | Kwan et al. | 327/554 |
| 5,528,240 * | 6/1996 | Wilson et al. | 341/143 |
| 5,530,390 | 6/1996 | Russell | 327/164 |
| 5,563,597 | 10/1996 | McCartney | 341/150 |
| 5,703,589 | 12/1997 | Kalthoff et al. | 341/172 |
| 5,821,892 * | 10/1998 | Smith | 341/150 |
| B1 4,939,516 * | 10/1993 | Early | 341/143 |

FOREIGN PATENT DOCUMENTS

| | | |
|---|---|---|
| 2278247 | 11/1994 | (GB). |
| 61-126823 | 6/1986 | (JP). |
| WO92/22961 | 12/1992 | (WO). |

* cited by examiner

Primary Examiner—Tesfaldet Bocure
(74) Attorney, Agent, or Firm—Cahill, Sutton & Thomas P.L.C.

(57) ABSTRACT

A system for reducing sensitivity of an integrated circuit chopper-stabilized amplifier to intermodulation applies a pseudo-random sequence signal (11A) to an LSB of a first input of a first adder. An error feedback signal (18) is applied to a second input of the first adder and a first input of a second adder (16). A 1-bit quantization signal ($\phi_{CH}$) is produced as an MSB of an output of the first adder and applied to an LSB of a second input of the second adder (16). An error signal (16A) representing the difference between the quantization signal ($\phi_{CH}$) and the error feedback signal (18) is produced by the second adder (16). The error signal (16A) is delayed a predetermined amount to produce the error feedback signal (18), wherein energy of the quantization signal ($\phi_{CH}$) is spread over a broad frequency spectrum between DC and $F_S/2$. A pair of out-of-phase, non-overlapping chopping signals from the quantization signal ($\phi_{CH}$). The chopping signals are applied to corresponding chopper switches of the chopper stabilized amplifier. The chopper stabilized amplifier is used in an integrator of a delta-sigma modulator to reduce sensitivity of analog-to-digital conversion to intermodulation in the delta-sigma modulator.

32 Claims, 4 Drawing Sheets

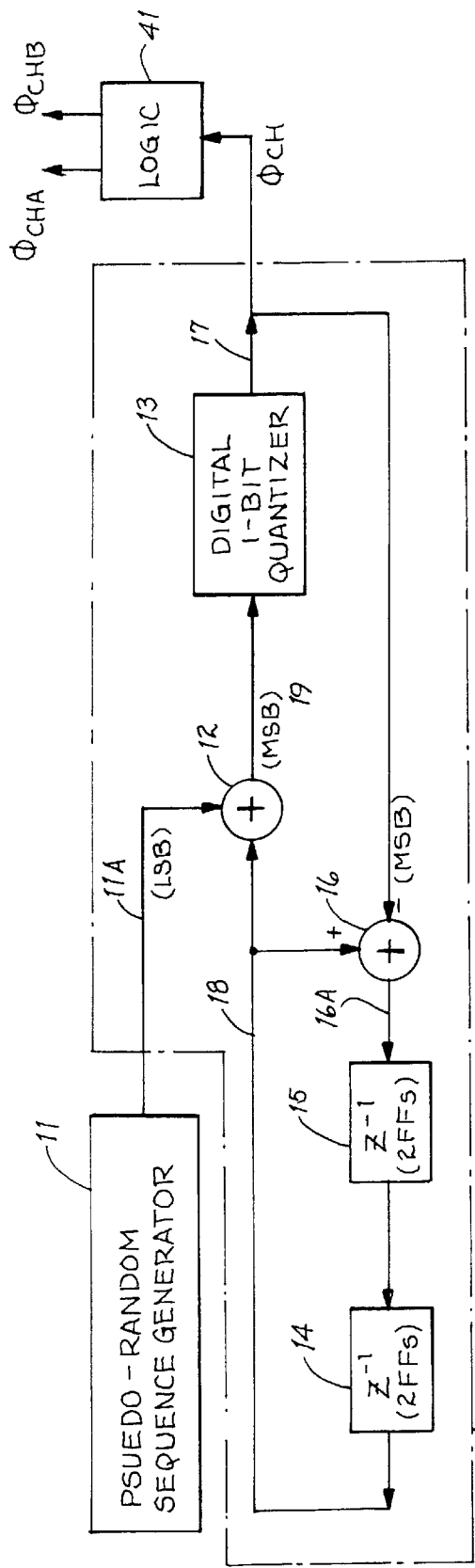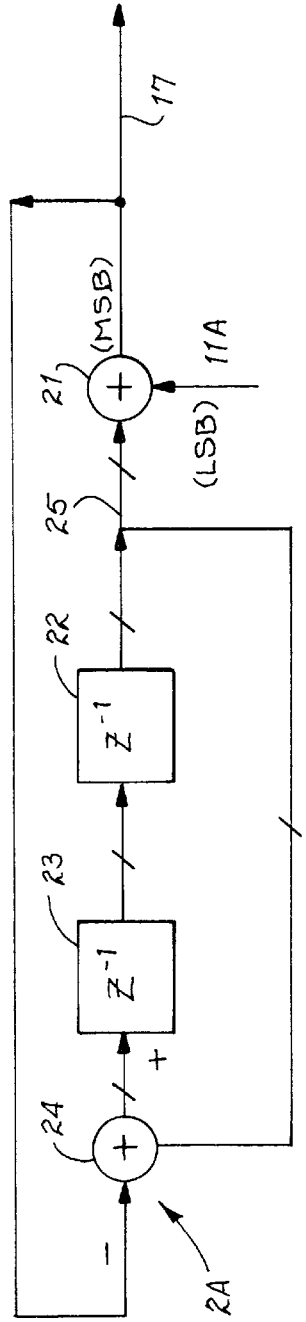
FIG. 2A
FIG. 2B

FREQUENCY-SHAPED PSEUDO-RANDOM CHOPPER STABILIZATION CIRCUIT AND METHOD FOR DELTA-SIGMA MODULATOR

BACKGROUND OF THE INVENTION

The invention relates to techniques for chopper-stabilizing a delta-sigma modulator to improve the conversion accuracy thereof, and more particularly to reducing conversion inaccuracies caused by intermodulation between chopper clock signals and the delta-sigma modulator output which causes high frequency "tones" to be aliased back to the base band of the delta-sigma modulator.

By way of background, the closest prior art is believed to include the combination of the assignee's U.S. Pat. No. 5,703,589 (Kalthoff et al.) issued Dec. 30, 1997, incorporated herein by reference and U.S. Pat. No. 5,115,202 (Brown) issued May 19, 1992. FIGS. 2A and 2B of U.S. Pat. No. 5,703,589 show a differential chopper-stabilized delta-sigma analog-to-digital converter. The first integrator of the delta-sigma modulator is shown in FIG. 2A of the '589 patent. The differential input signals to operational amplifier 18 are alternately reversed or swapped by fixed-frequency chopper signals $\phi_{CHA}$ and $\phi_{CHB}$, which are shown in FIG. 3 of the '589 patent. Similarly, the differential output signals produced by operational amplifier 18 also are alternately swapped in response to the same fixed-frequency chopper clock signals. This known chopping technique shifts DC offset and low frequency noise signals to a higher frequency equal to or close to the fixed frequency of the chopper clock signals. Such shifted offset and noise signals then are filtered out by a digital filter circuit.

A shortcoming of the foregoing chopper stabilization technique is that there inevitably is parasitic coupling between the fixed-frequency chopper clock signal and the delta-sigma modulator output containing high frequency "tones" when the analog input is at certain DC levels. This parasitic coupling, also referred to as "intermodulation", produces low frequency "images" of the high frequency tones within the base band of the delta-sigma modulator. The image signals within the base band cause conversion inaccuracy.

Note that even though one could choose a different chopping clock frequency, one will inevitably have a tone problem at certain input DC levels. This is because the frequency of a high frequency tone is a function of the DC level of the input signal level. When the high frequency tone moves close to the chopping frequency, intermodulation will bring the high frequency tone into the base band.

Above mentioned U.S. Pat. No. 5,115,202 discloses use of a pseudo-random frequency chopper clock generation circuit 12 that swaps the differential inputs and outputs of an operational amplifier, to thereby chopper stabilize the DC input offset and low frequency noise signals of the differential input signal. The pseudo-randomization of the chopper clock signal frequency effectively "spreads" chopper clock noise energy throughout the frequency spectrum, and thereby reduces the intermodulation between the amplifier input signal and the chopper clock signal which causes a side image of the input signal.

There remains an unmet need for a way of avoiding conversion errors caused in a delta-sigma analog-to-digital converter by intermodulation between a chopper stabilization clock signal and high frequency tones in the output of the delta-sigma modulator.

SUMMARY OF THE INVENTION

Accordingly, it is an object of the invention to provide a technique for reducing conversion errors due to intermodulation in a delta-sigma analog-to-digital converter.

It is another object of the invention to reduce the sensitivity of analog-to-digital conversion to intermodulation in a delta-sigma analog-to-digital converter.

It is another object of the invention to provide a clock signal having frequency-shaped pseudo-random frequency spectrum.

It is another object of the invention to reduce the effects of offset and low frequency noise in a delta-sigma modulator or an amplifier.

Briefly described, and in accordance with one embodiment thereof, the invention provides a frequency-shaping pseudo-random clock signal generator circuit including a pseudo-random sequence generator and a digital delta-sigma modulator. The digital delta-sigma modulator includes a feedback delay circuit, a first digital adder receiving as inputs a pseudo-random sequence signal produced by the pseudo-random sequence generator and an error feedback signal produced by the feedback delay circuit. A 1-bit quantizer produces a frequency-shaped pseudo-random clock signal in response to the pseudo-random sequence signal and the error feedback signal, and a second digital adder produces a digital error signal as an input to the feedback delay circuit in response to the frequency-shaped pseudo-random clock signal and the error feedback signal.

In another embodiment, the sensitivity of an integrated circuit chopper-stabilized amplifier to intermodulation is reduced by applying a pseudo-random sequence signal to a first input of a first adder, and applying an error feedback signal to a second input of the first adder and a first input of a second adder. A quantization signal is produced in response to the first adder and applied to an LSB of a second input of the second adder, which produces an error signal representing the difference between the quatization signal and the error feedback signal. The error signal is delayed a predetermined amount to produce the error feedback signal, wherein energy of the quantization signal is spread over a broad frequency spectrum between DC and $F_S/2$. A pair of out-of-phase, non-overlapping chopping signals are produced in response to the quantization signal and applied to the chopping signals to corresponding chopper switches of the chopper stabilized amplifier.

In another embodiment, a delta-sigma modulator includes a switched capacitor feedback reference voltage sampling circuit, an integrator, a comparator, a switched capacitor input sampling circuit, a plurality of chopper stabilization input switches coupling the switched capacitor input sampling circuit to an input of the integrator, a plurality of chopper stabilization output switches coupling an output of the integrator to an input of the comparator, and a frequency-shaped pseudo-random chopper clock signal generator circuit. The frequency-shaping pseudo-random chopper clock signal generator circuit includes a pseudo-random sequence generator and a digital delta-sigma modulator. The digital delta-sigma modulator includes a feedback delay circuit and a first digital adder receiving as inputs a pseudo-random sequence signal produced by the pseudo-random sequence generator and an error feedback signal produced by the feedback delay circuit. A 1-bit quantizer produces a frequency-shaped pseudo-random clock signal in response to the pseudo-random sequence signal and the error feedback signal. A second digital adder produces a digital error signal as an input to the feedback delay circuit in response to the frequency-shaped pseudo-random clock signal and the error feedback signal. A logic circuit produces complementary, non-overlapping chopper clock signals in response to the frequency-shaped pseudo-random clock signal. The complementary, non-overlapping chopper clock signals are applied to control various ones of the chopper stabilization input switches and chopper stabilization output switches.

BRIEF DESCRIPTION OF THE DRAWINGS

FIG. 2A is a block diagram of one embodiment of the frequency-shaping pseudo-random chopper clock generator in block 1 of FIG. 1.

FIG. 2B is a block diagram of another embodiment of a frequency-shaping pseudo-random chopper clock generator which could be used in block 1 of FIG. 1.

DETAILED DESCRIPTION OF THE PREFERRED EMBODIMENTS

Figure 1:
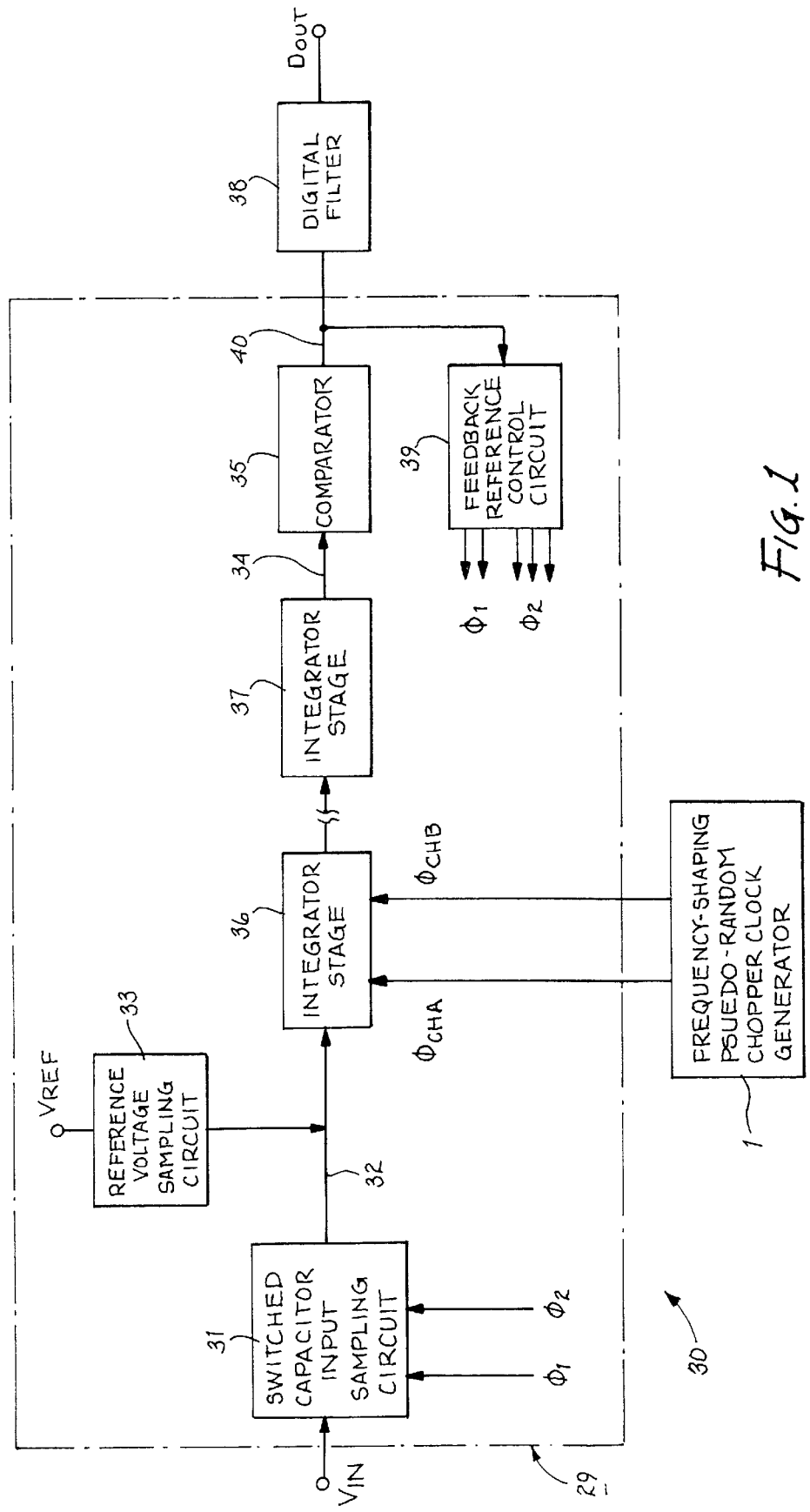
FIG. 1 is a block diagram of a chopper-stabilized delta-sigma modulator including a frequency-shaping pseudo-random chopper clock generator.

Referring to FIG. 1, analog-to-digital converter 30 includes a chopper-stabilized delta-sigma modulator 29, which includes a switched capacitor input sampling circuit 31 that samples a differential analog input $V_{IN}$. Two fixed-frequency clock signals $\phi 1$ and $\phi 2$ accomplish the analog input sampling in a known fashion, as disclosed in the above referenced U.S. Pat. No. 5,703,589. The sampled differential analog input signal appears between a pair of summing node conductors 32 which are coupled, respectively, to the differential inputs of a chopper-stabilized first integrator stage 36. Summing node conductors 32 also are coupled to corresponding terminals of a switched capacitor feedback reference voltage sampling circuit 33 that is similar to the circuitry 22A shown in FIG. 2A of the above referenced '589 patent. (Although a differential implementation is shown in FIG. 1, the invention described herein is equally applicable to a single ended implementation.)

Chopper-stabilized delta-sigma ADC 30 may also include a number of additional integrator stages such as 37 and associated switched capacitor feedback reference voltage supply circuits, which may or may not be chopper-stabilized. The differential output 34 of the final integrator stage 37 (or integrator stage 36 if it is the only one) are coupled to the inputs of a conventional differential comparator 35. The differential outputs 40 of comparator 35 are coupled to the inputs of both a conventional digital filter 38 and a conventional feedback reference control circuit 39. Feedback reference control circuit 39 produces the first-frequency clock signals $\phi_1$ and $\phi_2$, and also produces the additional clock signals $\phi_{1A}'$, $\phi_{1B}'$, $\phi_{2N}$, and $\phi_{2P}$ needed by reference voltage sampling circuit 33 as determined by the output of comparator 35, in a well known fashion. Digital filter 38 produces the digital output signal $D_{OUT}$ into which the analog input signal $V_{IN}$ is converted.

In accordance with the present invention, chopper-stabilized delta-sigma ADC 30 includes a frequency-shaped pseudo-random chopper clock generator circuit 1 that generates chopper clock signals $\phi_{CHA}$ and $\phi_{CHB}$ applied to at least the first integrator stage 36, each chopper clock signal having a frequency spectrum that is "shaped" as shown in FIG. 3, rather than being of a single fixed frequency as in all known prior chopper stabilized delta-sigma analog-to-digital converters.

Referring to FIG. 2A, frequency-shaping pseudo-random chopper signal generator circuit 1 includes a digital (rather than analog) first order delta-sigma modulator 2. It includes no input, which in effect is a zero value input. (That is, since the input is zero, the digital adder normally present in a delta-sigma modulator for adding the input to the output of delay element 14 is unnecessary and hence is omitted.) First order digital delta-sigma modulator 2 includes two 2-bit digital delay elements 14 and 15 (each of which can be implemented by a pair of conventional flip flops clocked at the $F_S$ sampling rate of delta-sigma modulator 29) connected in an error feedback circuit. The error feedback circuit includes a digital 2-bit adder 16 having a 2-bit (−) input connected to 2-bit bus 18. Adder 16 also includes a (−) input, an MSB of which is connected to conductor 17, and a 2-bit output 16A connected to the input of the first digital delay element 15. The output of first digital delay element 15 is connected to the input of second digital delay element 14, the output of which is connected to 2-bit bus 18. The output of delay element 14 provides a delayed serial digital signal on 2-bit bus 18, which is applied to the 2 bits of a first input of a 2-bit digital adder 12. An LSB bit of the second input of digital adder 12 is connected to the 1-bit output of pseudo-random sequence generator 11.

Pseudo-random sequence generator 11, which can be of conventional design such as a 1-bit maximum sequence generator described in the text "Shift Register Sequences", by S. Goloumb, Aegan Park Press, Laguna Hills, Calif., 1982, or the one shown in block 12 of the above-referenced '202 patent, produces a serial 1-bit pseudo-random signal on conductor 11A that is connected to a second input of digital adder 12.

In effect, the 1-bit pseudo-random signal on conductor 11A functions as a pseudo-random dither input to digital delta-sigma modulator 2. Digital adder 12 produces a 1-bit signal on conductor 19 which is the MSB of the output of 2-bit adder 12 and hence is equal to the sum of the 1-bit digital signal on conductor 11A and the 2-bit error feedback data on 2-bit bus 18. As such, the MSB adder output signal on conductor 19 actually functions as a digital 1-bit quantizer. That 1-bit quantizer function is illustrated by block 13 in FIG. 2A, although in the actual implementation of FIG. 2A conductor 19 is connected directly to conductor 17. The 1-bit quantizer signal on conductor 17 constitutes a frequency-shaped pseudo-random clock signal $\phi_{CH}$ on conductor 17.

Conductor 17 applies $\phi_{CH}$ to the (−) input of 2-bit digital adder 16 to provide the feedback necessary to accomplish the frequency shaping referred to. Conductor 17 also is connected to the input of a conventional logic circuit 41 that generates two chopper clock signals $\phi_{CHA}$ and $\phi_{CHB}$, wherein $\phi_{CHA}$ is identical to $\phi_{CH}$, and $\phi_{CHB}$ is out-of-phase with and does not overlap $\phi_{CHA}$. The 2-bit feedback structure in the digital delta-sigma modulator 2 shown in FIG. 2A was used because it very efficiently produces the low-frequency shaping indicated by A and high-frequency shaping indicated by B in the frequency spectrum of $\phi_{CH}$ shown in FIG. 3C. However, a 1-bit feedback structure or an N-bit feedback structure wherein N is greater then 2 also could be used.

Figure 3C:
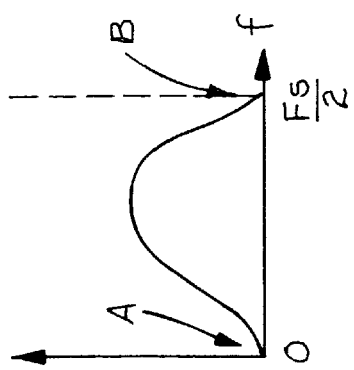
FIG. 3C is a graph of the frequency spectrum of the clock signal $\phi_{CH}$ produced by the frequency-shaping pseudo-random chopper clock generator of FIG. 2A.

Referring to the chopper clock frequency spectrum shown in FIG. 3C, frequency-shaping pseudo-random chopper clock generator 1 attenuates the DC offset and low frequency noise in the lower frequency region indicated by A so that those low frequency noise components are reduced. In the high frequency region B, the high frequency tone coupling is minimized at $F_S/2$, where the largest high-frequency tones are observed ($F_S$ being the sampling frequency of delta-sigma modulator 29).

One-bit digital delta-sigma modulator 2 operates to provide a feedback delay in which the two 2-bit delay elements 15 and 14 delay the difference between the 1-bit output 17 of digital quantizer 13 and the 2-bit word on 2-bit digital bus 18. That delayed 2-bit word is added to the 1-bit pseudo-random sequence produced on conductor 11A by pseudo-random sequence generator 11. The MSB of the 2-bit word produced by adder 12 represents the algebraic sign of that 2-bit word. The "1" bits of the pseudo-random sequence on conductor 11A add an LSB value to the delayed 2-bit word on conductor 18 to represent one half of the quantizing level.

Figure 3B:
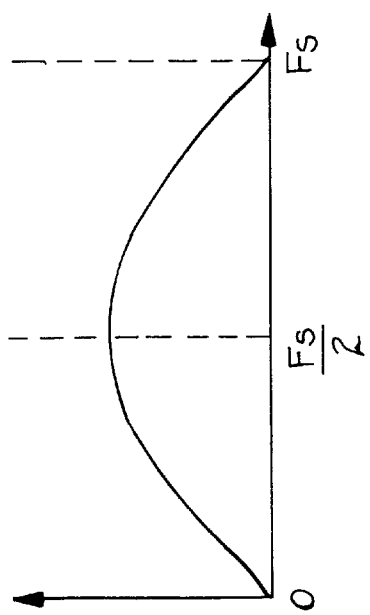
FIG. 3B is a frequency spectrum of the frequency-shaped pseudo-random clock signal $\phi_{CH}$ which would be produced by digital delta-sigma modulator 2 in FIG. 2A if the second delay element 14 were to be omitted.
Figure 3A:
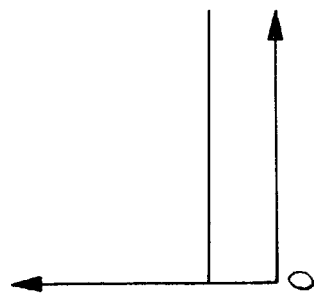
FIG. 3A is a frequency spectrum of the signal on conductor 11A produced by pseudo-random sequence generator 11 in FIG. 2A.
Figure 4:
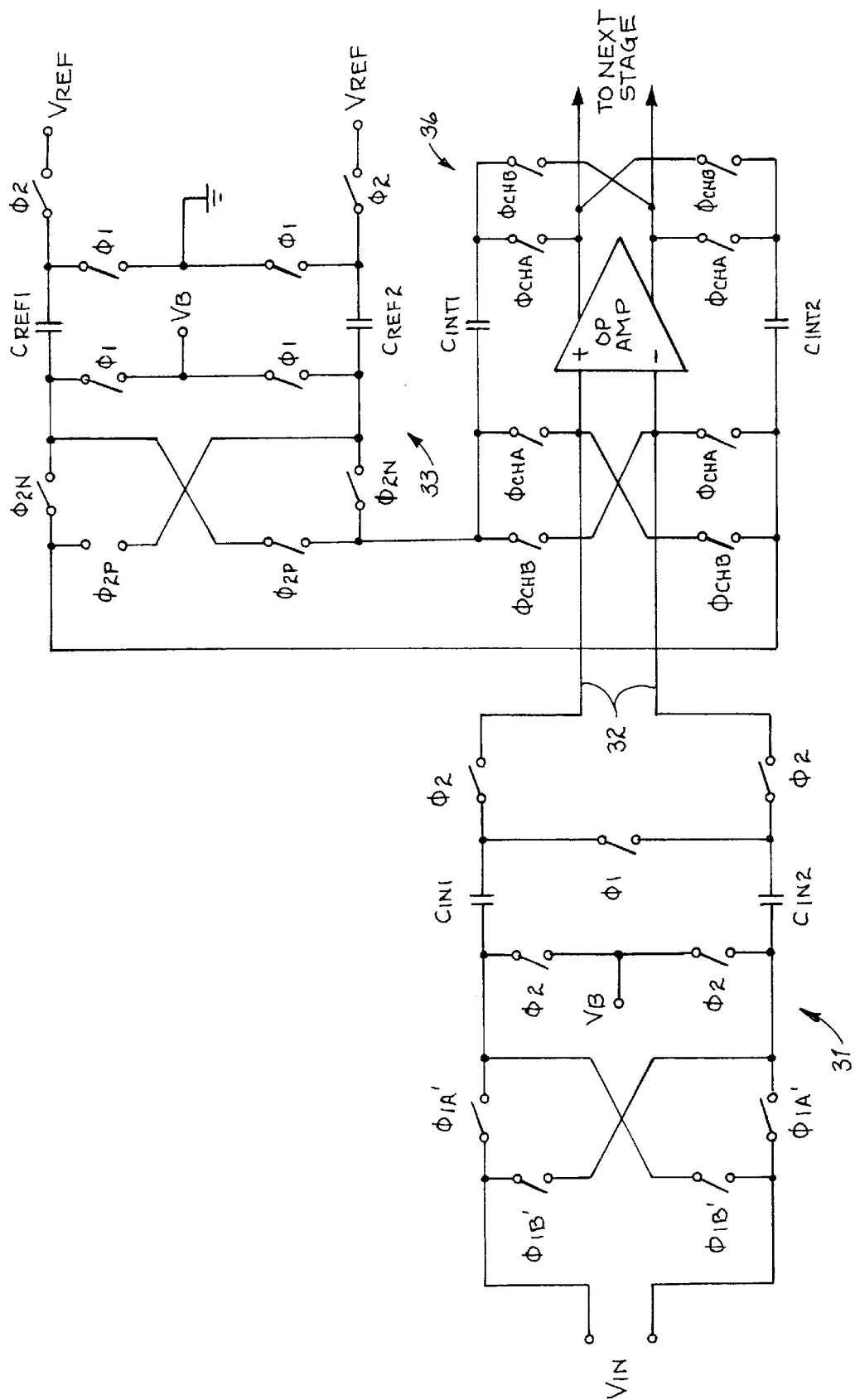
FIG. 4 is a schematic diagram of one embodiment of the chopper stabilized integrator stage 36 in FIG. 1.

The above described first order digital modulator structure with error feedback as shown in FIG. 2A provides two delays rather than one, in the loop feedback circuit. The provision of the two delays in the feedback results in the output of the delta-sigma modulator having attenuation not only at DC but also at $F_S/2$. This results in digital delta-sigma modulator 2 having the desired frequency-shaped spectrum shown in FIG. 3C. Perhaps this can be understood by noting that the sequence signal produced on conductor 11A by pseudo-random sequence generator 11 has the frequency spectrum shown in FIG. 3A. By using digital delta-sigma modulator 2 with only one delay, that is, with delay element 14 omitted and the output of delay element 15 connected directly to 2-bit bus 18, the frequency spectrum of $\phi_{CH}$ has a peak at $F_S/2$, as shown in FIG. 3B. Pseudo-random sequence generator 11 is clocked at $F_S$. The effect of adding the second delay element 14 as shown in FIG. 2A has the effect of halving the frequency scale, to produce the frequency spectrum shown in FIG. 3C, with a peak at $F_S/4$, rather than $F_S/2$, as those skilled in the art of digital signal processing will recognize.

The frequency spectrum shown in FIG. 3B in some cases will be quite adequate for the purpose of providing a frequency-shaped pseudo-random clock signal even though there is no attenuation of noise at $F_S/2$. This is because the spreading of the clock signal energy which results by chopping at a pseudo-random frequency rather than at a fixed frequency sharply reduces the clock signal energy at the fixed frequency. If the parasitic coupling which constitutes the above mentioned intermodulation is reasonably low, then using a single delay element in the feedback loop is adequate. Thus, an appreciable but less effective spreading of the output signal energy of $\phi_{CH}$ (and hence $\phi_{CHA}$ and $\phi_{CHB}$) would be achieved using only a single delay element instead of using the two delay elements 14 and 15.

Note that the unusual no-input, 1-bit digital delta-sigma modulator of FIG. 2 with 2-bit internal feedback, even if modified to accept an input, would not be practical for digital-to-analog conversion.

The above circuitry thus frequency-shapes the spectrum of the pseudo-random chopper clock $\phi_{CH}$ produced on conductor 17 to provide the spectrum for the chopper clock energy shown in the graph of FIG. 3C, thus reducing the sensitivity to intermodulation at any DC input level for an analog modulator with chopper stabilization.

However, it should be appreciated that if "pure" or "unshaped" pseudo-random chopping were used, it would "spread" DC input error energy and DC offset energy across the base band. Such increased base band noise often can not be tolerated. However, in accordance with the present invention, the attenuation at and near DC which produces region A in the spectrum (FIG. 3) of frequency-shaping pseudo-random chopper clock generator 1 reduces the increased base band noise that would result from pure (i.e., "unshaped") pseudo-random chopping. Therefore, most of the DC and offset error is "shaped" to higher frequencies which then are removed by a subsequent filter so the resulting base band is relatively noiseless. Providing the attenuation in region B (FIG. 3A) in the spectrum of frequency-shaping pseudo-random clock generator 1 also reduces the sensitivity of delta-sigma modulator 30 to inter-modulation at and near the frequency $F_S/2$.

Thus, the pseudo-random spreading of the carrier signal over the entire spectrum prevents concentration of too much energy in a particular band. This, in combination with the "frequency-shaping" accomplished by 2-bit digital delta-sigma modulator, reduces the sensitivity of delta-sigma modulator 30 to the above mentioned intermodulation. Use of the frequency-shaping pseudo-random chopper clocks $\phi_{CHA}$ and $\phi_{CHB}$ produced in accordance with the present invention greatly improves the conversion accuracy of delta-sigma ADC 30 of FIG. 1 because the harmful effects of intermodulation between the frequency-shaped pseudo-random chopper clocks and the delta-sigma modulator output 40 are sharply reduced by the above-mentioned "spreading" of chopper clock output signal energy across the entire frequency spectrum. Consequently, the delta-sigma modulator 30 of FIG. 1 is less sensitive to intermodulation at DC and low frequency input levels.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention.

For example, a modified digital delta-sigma modulator with an integrator based architecture as shown in FIG. 2B could be used instead of the error feedback architecture shown in FIG. 2A. In FIG. 2B, first order digital delta-sigma modulator 2A includes a first delay element 23 and a second delay element 22. The input of delay element 23 is connected to the output of a 2-bit digital adder 24. The output of delay element 23 is connected to the input of delay element 22, the output of which is connected by 2-bit bus 25 to a first input of 2-bit digital adder 21. As in FIG. 2A, the output sequence 11A produced by pseudo-random sequence generator 11 is applied in FIG. 2B to the LSB of a second input of digital adder 21. The MSB output of digital adder 21 functions as a quantizer just as in FIG. 2A, producing $\phi_{CH}$ on conductor 17, which is fed back to the MSB of a first input of a 2-bit digital adder 24. The output of 2-bit adder 24 is connected to the input of delay element 23. The 2-bit digital signal on bus 25 is fed back to a second input of 2-bit adder 24. Digital delta-sigma modulator 2A could be a lower or higher order delta-sigma modulator by providing fewer or more integrators, respectively, in the architecture of FIG. 2B. The digital delta-sigma modulator structure of both FIGS. 2A and 2B both provide a 1-bit output, and both use dither as an LSB input to smooth the output spectrum, have no input (i.e., implicitly, a zero input), and can be of any order suitable to achieve the desired spreading of chopper clock energy and a low level of chopper clock energy at and near DC. As is the case for the circuit of FIG. 2A, eliminating one of the delay elements 22 or 23 in FIG. 2B results in the frequency spectrum of FIG. 3B rather than FIG. 3C.

The chopper stabilization techniques described above in conjunction with a switched capacitor delta-sigma modulator also are applicable to a "continuous time" delta-sigma modulator. The term "continuous time" refers to a circuit such as a delta-sigma modulator that uses resistors or current sources in place of switched capacitor networks. Thus, the charge being integrated by an integrator in a "continuous time" delta-sigma modulator is integrated continuously, rather than in discrete quantities as in a switched capacitor delta-sigma modulator, hence the term "continuous time". Also, the frequency-shaped pseudo-random chopping described herein is applicable to chopper switches that are located within, rather than external to, an operational amplifier and are coupled to the inputs or outputs of the operational amplifier from within.

What is claimed is:

1. A method of reducing sensitivity of an integrated circuit chopper-stabilized amplifier to intermodulation therein, comprising:
   (a) applying a pseudo-random sequence signal to a first input of a first adder;
   (b) applying an error feedback signal to a second input of the first adder and a first input of a second adder;
   (c) producing a quantization signal in response to the first adder and applying the quantization signal to an MSB of a second input of the second adder;
   (d) producing an error signal representing the difference between the quantization signal and the error feedback signal by means of the second adder;
   (e) delaying the error signal a predetermined amount to produce the error feedback signal, wherein energy of the quantization signal is spread over a broad frequency spectrum between DC and a chopping frequency; and
   (f) producing a pair of out-of-phase, non-overlapping chopping signals from the quantization signal and applying the chopping signals to corresponding chopper switches of the chopper stabilized amplifier.

2. The method of claim 1 wherein the quantization signal is a 1-bit signal applied to the MSB of the second input of the second adder.

3. The method of claim 2 wherein the pseudo-random sequence signal is a 1-bit pseudo-random sequence signal.

4. The method of claim 3 including delaying the error signal twice by the predetermined amount to achieve increased attenuation near DC and near the frequency $F_S/2$.

5. A frequency-shaping pseudo-random clock signal generator circuit comprising a pseudo-random sequence generator and a digital delta-sigma modulator, the digital delta-sigma modulator including a feedback delay circuit, a first digital adder receiving as inputs a pseudo-random sequence signal produced by the pseudo-random sequence generator and an error feedback signal produced by the feedback delay circuit, a 1-bit quantizer producing a frequency-shaped pseudo-random clock signal in response to the pseudo-random sequence signal and the error feedback signal, and a second digital adder producing a digital error signal as an input to the feedback delay circuit in response to the frequency-shaped pseudo-random clock signal and the error feedback signal.

6. The frequency-shaping pseudo-random clock signal generator circuit of claim 5 wherein the digital delta-sigma modulator 2 is a 1-bit digital delta-sigma modulator.

7. The frequency-shaping pseudo-random clock signal generator circuit of claim 6 wherein the first and second digital adders are 2-bit adders, and the first digital adder has a first LSB input receiving a 1-bit output sequence from the pseudo-random sequence generator.

8. The frequency-shaping pseudo-random clock signal generator circuit of claim 7 wherein the second adder produces the error signal as a 2-bit signal and the feedback delay circuit produces the error feedback signal as a 2-bit signal.

9. The frequency-shaping pseudo-random clock signal generator circuit of claim 8 wherein the feedback delay circuit includes at least one 2-bit delay circuit.

10. The frequency-shaping pseudo-random clock signal generator of claim 9 wherein the feedback delay circuit includes first and second sequentially coupled 2-bit delay circuits.

11. The frequency-shaping pseudo-random clock signal generator of claim 7 wherein the 1-bit quantizer includes an MSB bit of the output of the first adder.

12. In an amplifier including a plurality of chopper stabilization input switches coupling an input port to an input of the amplifier, and a plurality of chopper stabilization output switches coupling an output of the amplifier to an output port, the improvement comprising a frequency-shaping pseudo-random chopper clock signal generator circuit including a pseudo-random sequence generator and a digital delta-sigma modulator, the digital delta-sigma modulator including a feedback delay circuit, a first digital adder receiving as inputs a pseudo-random sequence signal produced by the pseudo-random sequence generator and an error feedback signal produced by the feedback delay circuit and functioning as a 1-bit quantizer to produce a frequency-shaped pseudo-random clock signal in response to the pseudo-random sequence signal and the error feedback signal, a second digital adder producing a digital error signal as an input to the feedback delay circuit in response to the frequency-shaped pseudo-random clock signal and the error feedback signal, and a logic circuit producing, in response to the pseudo-random clock signal, complementary, non-overlapping chopper clock signals applied to control various ones of the chopper stabilization input switches and chopper stabilization output switches.

13. In the amplifier as recited in claim 12 the improvement wherein the frequency-shape pseudo-random clock signal constitutes a 1-bit quantization signal applied to the MSB of the second input of the second adder.

14. In the amplifier as recited in claim 13 the improvement wherein the pseudo-random sequence signal is a 1-bit pseudo-random sequence signal.

15. In the amplifier as recited in claim 14 the improvement wherein the feedback delay circuit delays the error signal twice by a predetermined amount to achieve increased attenuation near DC and near a chopping frequency.

16. In the amplifier as recited in claim 12 the improvement wherein the digital delta-sigma modulator 2 is a 1-bit digital delta-sigma modulator.

17. In the amplifier as recited in claim 16 the improvement wherein the first and second digital adders are 2-bit adders, and the first digital adder has a first LSB input receiving a 1-bit output sequence from the pseudo-random sequence generator.

18. In the amplifier as recited in claim 17 the improvement wherein the second adder produces the error signal as a 2-bit signal and the feedback delay circuit produces the error feedback signal as a 2-bit signal.

19. In the amplifier as recited in claim 18 the improvement wherein the feedback delay circuit includes at least one 2-bit delay circuit.

20. In the amplifier as recited in claim 19 the improvement wherein the feedback delay circuit includes first and second sequentially coupled 2-bit delay circuits.

21. In the amplifier as recited in claim 17 the improvement wherein the 1-bit quantizer includes an MSB bit of the output of the first adder.

22. A delta-sigma modulator comprising an integrator, a comparator, a switched capacitor input sampling circuit, a plurality of chopper stabilization input switches coupling the switched capacitor input sampling circuit to an input of the integrator, a plurality of chopper stabilization output switches coupling an output of the integrator to an input of the comparator, and a frequency-shaping pseudo-random chopper clock signal generator circuit including a pseudo-random sequence generator and a digital delta-sigma modulator, the digital delta-sigma modulator including a feedback delay circuit, a first digital adder receiving as inputs a pseudo-random sequence signal produced by the pseudo-random sequence generator and an error feedback signal produced by the feedback delay circuit and functioning as a 1-bit quantizer producing a frequency-shaped pseudo-random clock signal in response to the pseudo-random sequence signal and the error feedback signal, a second digital adder producing a digital error signal as an input to the feedback delay circuit in response to the frequency-shaped pseudo-random clock signal and the error feedback signal, and a logic circuit producing in response to the frequency-shaped pseudo-random clock signal, complementary, non-overlapping chopper clock signals applied to control various ones of the chopper stabilization input switches and chopper stabilization output switches.

23. In the delta-sigma modulator as recited in claim 22, the improvement wherein the frequency-shaped pseudo-random clock signal constitutes a 1-bit quantization signal applied to the MSB of the second input of the second adder.

24. In the amplifier as recited in claim 23 the improvement wherein the pseudo-random sequence signal is a 1-bit pseudo-random sequence signal.

25. In the amplifier as recited in claim 24 the improvement wherein the feedback delay circuit delays the error signal twice by a predetermined amount to achieve increased attenuation near DC and near a chopping frequency.

26. In the amplifier as recited in claim 22 the improvement wherein the digital delta-sigma modulator 2 is a 1-bit digital delta-sigma modulator.

27. In the amplifier as recited in claim 26 the improvement wherein the first and second digital adders are 2-bit adders, and the first digital adder has a first LSB input receiving a 1-bit output sequence from the pseudo-random sequence generator.

28. In the amplifier as recited in claim 27 the improvement wherein the second adder produces the error signal as a 2-bit signal and the feedback delay circuit produces the error feedback signal as a 2-bit signal.

29. In the amplifier as recited in claim 28 the improvement wherein the feedback delay circuit includes at least one 2-bit delay circuit.

30. In the amplifier as recited in claim 29 the improvement wherein the feedback delay circuit includes first and second sequentially coupled 2-bit delay circuits.

31. In the amplifier as recited in claim 23 the improvement wherein the 1-bit quantizer includes an MSB bit of the output of the first adder.

32. A delta-sigma modulator comprising a chopper-stabilized integrator includeing a plurality of chopper stabilization input switches coupled to an input of the integrator and a plurality of chopper stabilization output switches coupled to an output of the integrator, a quantizer having an input coupled to an output of the integrator, an input signal acquiring circuit controlled by a switched reference feedback circuit and having an output coupled to the input of the integrator, and a frequency-shaped pseudo-random chopper clock signal generator circuit including a pseudo-random sequence generator and producing a frequency-shaped pseudo-random clock signal, and a logic circuit producing, in response to the frequency-shaped pseudo-random clock signal, chopper clock signals applied to control various ones of the chopper stabilization input switches and chopper stabilization output switches.

* * * * *